United States Patent
Paul (12) 
(10) Patent No.: US 10,302,730 B2
(45) Date of Patent: May 28, 2019

(54) MAGNETIC RESONANCE METHOD AND APPARATUS TO ACTIVATE A CONTROL SEQUENCE

(71) Applicant: Siemens Healthcare GmbH, Erlangen (DE)

(72) Inventor: Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 101 days.

(21) Appl. No.: 15/404,344

(22) Filed: Jan. 12, 2017

(65) Prior Publication Data

US 2017/0199262 A1 Jul. 13, 2017

(30) Foreign Application Priority Data

Jan. 12, 2016 (DE) .......................... 10 2016 200 228

(51) Int. Cl.
 *G01R 33/54* (2006.01)
 *G01R 33/563* (2006.01)
 *G01R 33/565* (2006.01)

(52) U.S. Cl.
 CPC ..... *G01R 33/56509* (2013.01); *G01R 33/543* (2013.01); *G01R 33/56341* (2013.01)

(58) Field of Classification Search
 CPC ............ G01R 33/56509; G01R 33/543; G01R 33/56341

See application file for complete search history.

(56) References Cited

U.S. PATENT DOCUMENTS

| | | | | |
|---|---|---|---|---|
| 9,782,141 | B2 * | 10/2017 | Yu .......................... | A61B 5/055 |
| 2013/0049756 | A1 | 2/2013 | Ernst et al. | |
| 2014/0159721 | A1 * | 6/2014 | Grodzki ................. | G01R 33/48 |
| | | | | 324/309 |
| 2015/0265220 | A1 | 9/2015 | Ernst et al. | |

* cited by examiner

*Primary Examiner* — Rodney A Bonnette
(74) *Attorney, Agent, or Firm* — Schiff Hardin LLP

(57) ABSTRACT

In a method and magnetic resonance (MR) apparatus, for an MR control sequence is activated that contains a large number of blocks that are to be activated successively, with a block of the blocks that are to be played successively having an excitation module for exciting spins in a first region of an examination object and an encoding module for spatial encoding of spins excited in the first region and for recording a signal emitted by spins excited in the first region. A sensor detects an external movement of the examination object during activation of an excitation module of a block. An optimization computer carries out an optimization of the encoding module of this block based on the detected external movement and generates an optimized encoding module. The optimized encoding module is activated.

10 Claims, 3 Drawing Sheets

MAGNETIC RESONANCE METHOD AND APPARATUS TO ACTIVATE A CONTROL SEQUENCE

BACKGROUND OF THE INVENTION

Field of the Invention

The invention concerns a method for operating playing a magnetic resonance apparatus according to a control sequence, an optimization computer for optimizing such a control sequence, as well as a magnetic resonance apparatus and a non-transitory data storage medium designed to implement such a method.

Description of the Prior Art

In magnetic resonance imaging (MR imaging) an MR control sequence, composed of a sequence of radio-frequency pulses (RF pulses), in particular excitation pulses and refocusing pulses and gradient pulses that are to be emitted coordinated therewith, is activated (emitted) by a magnetic resonance scanner in order to acquire raw MR data from an examination object. The gradient pulses generate dynamic magnetic field gradients in various directions, and these are used for spatial encoding the MR signals caused by the radio-frequency pulses. Readout windows must be set at a time appropriate therewith, and these specify the periods in which the induced magnetic resonance signals are detected. RF pulses and gradient pulses can also be called MR pulses.

The duration of an MR control sequence can typically be between a few seconds and several minutes, depending on the type of MR control sequence and examination. Movement of the examination object in this period typically leads to a reduction in the quality of the resulting MR images.

SUMMARY OF THE INVENTION

An object of the invention is to provide a method for operating an MR scanner with an MR control sequence, wherein the effect of movement of the examination object on the MR data can be reduced. Furthermore, it is an object of the invention to provide a magnetic resonance apparatus and a non-transitory computer-readable data carrier designed to implement such a method.

The inventive method uses an MR control sequence composed of a large number of sequence blocks that are to be activated successively, wherein one block of the multiple blocks that are to be activated successively has an excitation module for exciting nuclear spins in a first region of an examination object, and an encoding module for spatially encoding MR signals emitted by the nuclear spins excited in the first region, and for recording the signal emitted by the spins excited in the first region. A sensor detects an external movement of the examination object. If the sensor detects an external movement during activation of the excitation module of the aforementioned block, then an optimization computer implements an optimization of the encoding module of that block based on the detected external movement and generates an optimized encoding module, which is activated.

An MR control sequence typically includes RF and gradient pulses and at least one period during which an MR signal can be recorded. A period of this kind can be called a readout window. The MR signal is typically influenced by the timing, i.e. the sequence of RF and gradient pulses and the readout window. The MR pulses, i.e. the RF and gradient pulses, and the readout window of an MR control sequence, are preferably combined into a number of blocks, usually a large number of such blocks. An MR control sequence is typically designed such that the magnetic resonance scanner, which activates (emits) the MR control sequence, can acquire raw data from a recording region of an examination object to be displayed. An examination object can be, for example, a patient, a test person or a phantom. The head of a patient can be chosen as the recording region, for example, by the operator of the magnetic resonance apparatus. The blocks encompassed by the MR control sequence are preferably activated successively and are typically designed such that each block has an excitation module and an encoding module.

A first such block typically has an excitation module and an encoding module, with the timing typically causing the excitation module of the first block to be activated before the encoding module of the first block. The excitation module typically has an RF pulse with which certain nuclear spins are tilted so as to give the spin a transverse magnetization. In addition, the excitation module can limit the region of the spins modulated by the RF pulse, for example by the activation of a gradient pulse. The MR pulses activated by the excitation module typically modulate spins in a first region of the object. The first region is typically encompassed by the recording region and can be a section of it. In certain MR control sequences, the first region is preferably not encompassed by the recording region, such as, for example when using a Time-of-Flight technique in MR imaging. Here the spins excited in the first region preferably move from the excitation region to the recording region where they typically generate an MR signal.

The spins modulated by the excitation module of the first block in the first region are changed by the encoding module of the first block, for example by RF and gradient pulses, in such a way as to produce an echo, which can be recorded during a readout window defined by the encoding module. The encoding module can have a number of RF pulses and readout windows. Gradient pulses activated in the encoding module typically enable a spatial allocation of the recorded echo to the spins modulated by the excitation module. These echoes can be called an MR signal.

The blocks of an MR control sequence are preferably characterized by the various blocks having the same recurring structure. The various blocks preferably have the same number of excitation modules and encoding modules and/or the same timing between an excitation module and an encoding module. The excitation module of a block may differ from the excitation module of another block in terms of the amplitude of an MR pulse. An encoding module of a block may differ from an encoding module of another block in terms of the amplitude of an MR pulse, and/or a gradient moment of a gradient pulse. A gradient moment is defined by the integral of the gradient amplitude over time. An excitation module and an encoding module of a block typically refer to the excitation, encoding and reading out of spins from one region of the recording region. The MR control sequence can be designed such that during the activation of different blocks, which respectively relate to different regions of the recording region, the blocks at least partially overlap by, for example, being nested with respect to each other. An MR control sequence is typically activated by a control of the required hardware components of the data acquisition scanner in accordance with the specification of the MR control sequence.

External movement of the examination object typically involves a movement of the surface of the examination object. The external movement can be detected, for example, by a sensor, in particular a camera. The external movement that can be detected by the sensor preferably correlates with a movement of the recording region to be displayed, in particular the first region. The external movement preferably characterizes a movement of the first region.

Based on such a movement detected during activation of the excitation module of the first block, the optimization computer is designed to implement an optimization of the encoding module of the first block, which therefore belongs to the same block as the excitation module. The optimized encoding module differs from the encoding module originally provided for the first block in such a way that the sensed external movement of the examination object, which took place during activation of the excitation module of that block, is taken into account by the optimized encoding module. The effect of the external movement on the data to be read out is preferably reduced by activation of the optimized encoding module.

Compared to the encoding module originally encompassed by the first block, the optimized encoding module can comprise other gradient pulses and/or, in particular, gradient pulses having a different gradient moment and/or gradient amplitude. Furthermore, the duration of gradient and/or RF pulses can be changed or the timing within the encoding module can be changed. These measures preferably lead to the spatial characteristics of the gradient pulses played by the optimized encoding module correlating with the external movement in such a way that the effect of the external movement on the MR control sequence is reduced.

It is also possible for an MR pulse encompassed by the original encoding module to be eliminated by the optimization in the optimized encoding module, for example, by assigning an amplitude of zero to that MR pulse on the optimized encoding module. If the external movement is, for example, so strong that it cannot be compensated by the above-described modulation of at least one MR pulse, then data recording using the encoding module encompassed by the first block can be dispensed with. This dispensation of data recording can be achieved, for example, by setting the amplitude of an MR pulse encompassed by the original encoding module at zero. Further changes to the encoding module that are considered expedient to those skilled in the art are also possible during the optimization. In particular, the intensity of the external movement can be taken into account during the optimization.

The inventive method accordingly makes use of external movement being detected during activation of the excitation module of the sequence block. An optimization of the encoding module belonging to the sequence block is carried out on the basis of the detected external movement, resulting in an optimized encoding module. During further activation of that sequence block of the MR control sequence, the optimized encoding module is activated instead of the encoding module originally encompassed by that block.

An advantage of the inventive method is that an external movement of the examination object can be detected by a sensor so an optimization of the MR control sequence can be performed within a block. In particular, the encoding module of a block can be matched to the excitation module of that block such that the effect of the external movement on the data is lessened to be read out, and so the quality of the resulting images is improved (or at least not degraded). The method can avoid the repetition of recording data from the examination object and therefore bring about a time reduction in the examination, even though an external movement has occurred during activation of the MR control sequence.

This is advantageous particularly, if a contrast medium is administered to the examination object during activation of the MR control sequence. In this case, repetition of recording would require that the examination be carried out again on a different day. This also requires repeated contrast medium, which may present a risk to possible harm to the examination object, and has significant associated effort and cost. Depending on the contrast medium used, these disadvantages may exist even when the contrast medium is administered before activation of the MR control sequence.

If the excitation module of the MR control sequence includes, for example, a navigator for monitoring external movement, this becomes superfluous as a result of the inventive method. The use of such a navigator typically extends the duration of the MR control sequence. The duration of the examination thus can be reduced in accordance with the invention by avoiding the use of a navigator.

In an embodiment of the method, the excitation module includes a preparation module, which has at least one preparation pulse and is designed to prepare a second region of the object and consequently modulate a signal recorded by the encoding module.

Such a preparation pulse can be, for example, a gradient pulse or an RF pulse, and is typically encompassed by the excitation module and likewise activated during the excitation module. The task of the preparation module is typically preparation of a second region. Depending on the type of preparation, the second region can be disjunct from the first region or at least partly overlap with the first region.

The preparation module is preferably designed to modulate spins of the second region such that the signal to be read out by the encoding module is changed compared to the signal by emitted spins excited an excitation module without preparation module. For example the contrast, i.e. the brightness levels between various structures, can be changed. In particular, moving structures can be suppressed or highlighted in the resulting MR image by a preparation module. Typically, the signal of moving blood can be suppressed or diffusion can be highlighted in MR scans of patients in order to analyze, for example, the functionality of an organ. Furthermore, a preparation module can fulfill the function of a navigator by monitoring external movement and thereby induce a correction.

It has been found, particularly in the case of excitation modules having preparation modules, that the effect of an external movement on the following encoding module of the same block can significantly impair the quality of the resulting MR image. The preparation module can modulate spins and thereby give these spins properties that make the spins provided with properties different from other spins. An external movement before activation of the encoding module can externally affect the property in an uncontrolled manner, so when the signal is read out the property is not in the anticipated form. Instead, the property can adversely affect encoding and/or reading out of the MR signal.

An advantage of this embodiment of the method is that a movement detected during activation of a module decisive for the following course of the MR control sequence can be taken into account for the following course of the MR control sequence. Depending on the type of preparation module, the spins to be encoded by the encoding module and to be read out can have a property that can sensitively change with external movement. The inventive optimization can reduce the effect of the external movement on the quality of the resulting MR images. The resulting MR image can have a property prepared by the preparation module, such as the signal suppression of a blood flow.

In another embodiment of the method, the MR control sequence is designed such that recording of the data space corresponding to the first region requires activation of at least two blocks.

As noted, a block typically has an excitation module and an encoding module, wherein the encoding module specifies gradual spatial sampling of (i.e., filling, or data entry into) the data space in which the signal is present in the form of echoes. This data space in magnetic resonance imaging is typically called k-space. The resulting MR image typically results from the data entered in k-space by Fourier transformation. The k-space data, from which an MR image of the first region can be generated, are encoded by the encoding module and read out and entered into a memory. Typically all spins located in the first region and contributing to the signal can be excited by the excitation module. The number of echoes to be read out, i.e. the number of signals at individual points in k-space, which can be detected by an encoding module in the course of activation of a block, is dependent on the MR control sequence. Usually k-space cannot be fully acquired (filled) by one encoding module, so activation of a number of blocks is required in order to acquire the data for the first region. If this applies, the MR control sequence is called a multi-shot sequence.

If, for example, two blocks are necessary for acquisition, these typically differ in the gradient moments of the gradient pulses activated by the two encoding modules. The excitation modules of the two blocks are preferably identical. The data acquired by the first and second blocks are necessary for generating the resulting MR image of the region, which data are combined during reconstruction of the MR images.

MR control sequences for MR diffusion imaging based on RESOLVE, DWI or TSE sequences are examples of an MR control sequence designed in such a way.

It has been found that external movements can reduce the image quality particularly in multi-shot sequences. The adjustment of the encoding module to the condition changed by the external movement compared to the excitation module within a block is particularly advantageous with these types of sequence.

In another embodiment of the method, at least one of the following factors is taken into account during the optimization of the encoding module:
a direction of the external movement,
a direction of a magnetic field gradient encompassed by the excitation module,
a direction of a magnetic field gradient encompassed by the encoding module,
a relationship of at least two of the above-mentioned directions to each other.

Further factors that are considered expedient to those skilled in the art can also be taken into account during optimization. Magnetic field gradients are generated by gradient pulses, wherein the gradient pulses are expanded by the spatial information of the activated gradient coil. The severity of the effect of the external movement on a signal generated by the MR control sequence is typically dependent on at least one of aforementioned directions. In particular, the factors to be taken into account for the optimization can be chosen depending on the type of MR control sequence and the orientation of the recording region. If the excitation module includes a preparation module, then a magnetic field gradient encompassed by the preparation module can be a reference for the sensitivity of the MR control sequence in the direction, and/or orthogonally to the direction of this magnetic field gradient.

Typically, k-space is sampled by a combination of various encoding methods. For example, phase encoding and frequency encoding can take place. Various encoding methods are typically sensitive to different degrees with respect to external movement and its direction. It has been found that the relationship of the direction of the external movement to at least one direction of at least one of the gradient pulses to be activated can be critical for the quality of the resulting images. Taking into account the direction of the external movement typically requires a sensor that can detect the direction of the external movement. One of these directions is typically taken into account during optimization, in addition to the detected intensity of the external movement.

Taking into account at least one of these directions during optimization can reduce the effect of the external movement on the quality of the resulting MR images particularly effectively.

In a further embodiment of the method, the encoding module includes a magnetic field gradient and during optimization of the encoding module the optimization computer adjusts the magnetic field gradient according to a first optimization strategy such that the effect of the external movement on a conformity of the excitation module and encoding module is reduced.

The excitation module typically has at least one excitation magnetic field gradient. The excitation magnetic field gradient typically is activated so as to select (i.e., make the excitation effective only in) a region encompassing the first region, which is at least partly encoded by the encoding module and read out. The axes of the coordinate system in k-space, which creates the points in k-space at which data are entered, are defined by the magnetic field gradients belonging to the first block and its encoding, carried out in stages (steps). The coordinate system spanning k-space preferably remains constant during activation of the entire MR control sequence and, in particular, during activation of the first block. The coordinate system spanning k-space can change with an external movement. If an external movement occurs during activation of the excitation module, then an offset can occur between excited k-space and k-space to be read out. The offset typically means that k-space is not constant during the first block, i.e. it does not comply with the expected format. This can lead, for example, to phase differences between the excitation module and the encoding module, and this can lead, for example in the resulting MR images, to offset repetitions of the signal and/or signal smears.

According to the first optimization strategy, at least one of the magnetic field gradients encompassed by the encoding module is adjusted during optimization such that the offset of k-space can be reduced. The amplitude and/or gradient moment of the magnetic field gradient can typically be changed. The goal of optimization can be an elimination of the phase differences. The intensity of the external direction can also be taken into account in this embodiment of the method.

An advantage of this embodiment of the method is that the effect of the external movement on the resulting MR images according to the first optimization strategy can be particularly efficiently reduced by ensuring a constant k-space. Phase differences can accordingly be eliminated even during encoding and reading out of k-space. Thus, k-space used by the encoding module can be matched to k-space used by the excitation module, and this typically occurs by a correction of at least one gradient moment of at least one magnetic field gradient encompassed by the encoding module. The correction is typically does not extend the duration of the examination. A subsequent correction during reconstruction of the MR images is not necessary.

In a further embodiment of the method, a threshold value is given during optimization of the encoding module for the intensity of the external movement according to a second optimization strategy. Depending on the threshold value and intensity of the detected external movement, either the first optimization strategy is implemented or, during optimization of the encoding module, at least one sub-module encompassed by the encoding module is removed and/or the first block is activated once again.

The intensity of the external movement can be given, for example, in the form of a linear dimension. The length can describe the spatial deviation of a point on the surface of the examination object generated by the external movement. Preferably the point on the surface of the examination object which moves the most is chosen for determination of the intensity of the external movement. Furthermore, a threshold value can be supplied for the intensity of the external movement when the second optimization strategy is executed. The optimization computer preferably accesses this threshold value or determine it during execution of optimization. The data and/or algorithms and/or threshold value itself necessary for determining the threshold value are preferably stored in a database, with the database being accessible by the optimization computer. The threshold value can be, for example, a fixed value for a length. The threshold value can be given or determined, for example, from at least one of the following factors:
  the direction of the external movement,
  the first region which is excited by the first block,
  the region of k-space encoded by the encoding module of the first block,
  a direction of a magnetic field gradient encompassed by the first block.

Further factors that are considered expedient to those skilled in the art are also possible for the determination of the threshold value.

According to the second optimization strategy a check is preferably made as to whether the threshold value is, for example, undershot or exceeded by the intensity of the detected external movement. In a first case the first optimization strategy can be applied. In a second case the optimization can mean that at least one sub-module encompassed by the encoding module of the first block is removed. A sub-module can be an MR pulse or a readout window. In the second case there is preferably no acquisition of data in k-space by the encoding module with removal of at least one sub-module. The data to be acquired by means of the first block are consequently not acquired during activation of the first block. These data cannot be taken into account when generating the MR image. If the non-acquired data is located in a region of k-space that makes no significant contribution to the resulting MR image, and this relates, for example, to a peripheral corner of k-space, it may be the case that no renewed recording of the data is required.

Alternatively or additionally, for removing sub-modules in the second case, the first block is activated again, i.e. repeated. In the case of such repeated activation, the inventive method can be applied by detecting a further external movement. Repeated block activation ensures that all data of k-space required for the first region are recorded. These data optionally can replace data acquired in advance by the first block and affected by an external movement. These data are not affected by external movement.

The first case of the second optimization strategy is preferably applied when the threshold value is undershot. The second case of the second optimization strategy is preferably applied when the threshold value is exceeded.

Regardless of the chosen optimization strategy, the region of k-space encoded by the encoding module of the first block can be taken into account during optimization. If the first block relates, for example, to a part of k-space that affects the signal intensity to a below-average extent, an optimization of the encoding module of the first block can be omitted.

An advantage of this embodiment is that the optimization can occur dependent on the intensity of the detected external movement. A specific choice of the threshold value enables the data of k-space to be recorded as effectively as possible. If the threshold value is undershot, for example, the encoding module of the first block can be adjusted to the excitation module of the first block changed by the external movement. With external movements, the intensity of which exceeds the threshold value, the first optimization strategy is typically no longer sufficient to ensure a good quality of the resulting MR images. In this case, recording of the distorted data can be omitted. Thus no distorted data are taken into account during reconstruction of the MR images. In order to acquire the missing data in this case, in accordance with the invention the first block can be activated once again in order to acquire missing data, so preferably all required data of k-space are present at the conclusion of activation of the MR control sequence. The second optimization strategy can prevent the use of data afflicted by an inconsistency due to the external movement during the reconstruction of MR images of the first region. As a result, artifacts can be reduced better and/or avoided in the resulting MR images, even in the case of pronounced external movements. This can result in high quality MR images. Overall, a good balance can be ensured between the image quality and the time required for repeated activation of the first block.

In a further embodiment of the method, the first optimization strategy is carried out during optimization of the encoding module in the case of orthogonality of a direction of a magnetic field gradient encompassed by the excitation module to a direction of the external movement.

Gradient pulses, and therefore the magnetic field gradients, can be generated and emitted by at least one gradient coil. Clinical magnetic resonance devices can typically generate magnetic field gradients in three spatial directions, with the spatial directions being specified by the position and design of the typically three gradient coils. The three spatial directions are conventionally orthogonal to each other and they typically describe the horizontal and vertical directions and a direction perpendicular thereto which runs parallel to the main magnetic field of the magnetic resonance device.

The excitation module typically can have a gradient pulse that is to be activated at the same time as an RF pulse and that generates a magnetic field gradient. If the excitation module includes a preparation module, then this can have a gradient pulse dependent on the preparation module, which pulse can, for example, dephase transverse magnetization produced by an RF pulse. The magnetic field gradient required for this is typically located in the plane in which the transverse magnetization is present. With the condition that the sensor can detect the direction of the external movement, the first optimization strategy can be chosen when the direction of the external movement is orthogonal to a direction of a magnetic field gradient encompassed by the excitation module. The magnetic field gradient encompassed by the excitation module, and to be taken into account when choosing the optimization strategy, is typically already known to the optimization computer or can be determined by the optimization computer.

The first optimization strategy is therefore preferably chosen if the direction of the external movement and the direction of a magnetic field gradient encompassed by the excitation module have a clear orthogonal component to each other. The effect of the external movement on the encoding module is particularly effectively reduced by a change in the gradient moments of the gradient pulses that occur in this encoding module.

The excitation module of the first block can include, for example, a preparation module for blood suppression. The preparation module for blood suppression can cause the excitation of spins in a second region and activation of a spoiler module. Spins can be excited in the first region after activation of the preparation module. The encoding module of the first block can then be activated. The spoiler module typically has at least one magnetic field gradient in a spatial direction, along which preferably no spins are oriented after excitation of the second region. In particular, the spoiler module can include a further magnetic field gradient in a further direction, so spins that are not oriented in the direction desired by the excitation of the second region, after the excitation of the second region, are preferably dephased. The magnetic field gradients encompassed by the spoiler module can be used, for example, as a reference for the choice of optimization strategy. If the external movement occurs largely orthogonally to at least one magnetic field gradient encompassed by the spoiler module, the effect of the external movement on the encoding module can typically be efficiently reduced by the first optimization strategy.

An advantage of this embodiment of the method is that an appropriate optimization strategy can be chosen on the basis of knowledge of a functionality of a magnetic field gradient encompassed by the excitation module. The functionality of a magnetic field gradient encompassed by the excitation module is frequently determined by the direction thereof compared to further magnetic field gradients of the same block. The first optimization strategy typically involves a time-efficient method for correcting the external movement. The inventive method provides a guideline by which it can be determined whether the first optimization strategy can bring about efficient correction of the external movement.

In a further embodiment of the method, the second optimization strategy is carried out during optimization of the encoding module when a direction of a magnetic field gradient encompassed by the excitation module matches a direction of the external movement.

Compared to the previous embodiment, the case will be considered where the detected external movement matches a direction of a magnetic field gradient encompassed by the excitation module. In the illustrated example, wherein the excitation module includes a preparation module for blood suppression, the second optimization strategy is preferably carried out if the direction of the detected external movement matches a magnetic field gradient encompassed by the spoiler module. The magnetic field gradient encompassed by the spoiler module means that preferably no spin is oriented in its direction. An external movement in this direction typically induces a change in k-space that often cannot be sufficiently corrected according to the first optimization strategy. Depending on the choice of threshold value, with a slight external movement a correction according to the first optimization strategy can be carried out when the intensity of the external movement exceeds the threshold value by, for example, at least one sub-module belonging to the encoding module of the first block being removed and/or the first block being activated once again.

If the direction of a magnetic field gradient encompassed by the excitation module is considered, which is activated at least partly at the same time as a further magnetic field gradient, the direction used for comparison for the direction of the external movement can be any direction within the magnetic field gradients encompassed by the excitation module and plane spanned by the further magnetic field gradient.

An advantage of this embodiment of the method is that an appropriate optimization strategy can be chosen on the basis of knowledge of a functionality of a magnetic field gradient encompassed by the excitation module. The optimization strategy to be chosen is defined by the indicated condition. If the condition with the illustrated relationship of the directions largely occurs, a time-saving method, i.e. the first optimization strategy, or the second optimization strategy can be chosen dependent on a threshold value. The second optimization strategy can prevent the use of data afflicted by an inconsistency due to the external movement during reconstruction of the MR images of the first region.

In a further embodiment of the method, the sensor detects an external inter-block movement that occurs between a preceding block and a block following the preceding block. The optimization computer implements an optimization of the following block based on the external inter-block movement.

This embodiment of the method therefore evaluates and corrects the effect of an external movement that occurs between two successive blocks instead of the effect of an external movement within one block. The external inter-block movement typically describes an external movement that occurs between two successive blocks.

The optimization computer can implant an optimization of the block following the inter-block movement based on the detected external inter-block movement. Preferably, at least one magnetic field gradient encompassed by the following block is adjusted during the optimization. The optimization can occur, for example, according to the first or second optimization strategy. The goal of this optimization is typically the reduction in the effect of the external movement on a conformity of the two successive blocks. The changes in the following block, made by the optimization, can also be applied to the blocks that occur after the following block if there is no further external movement.

An advantage of this embodiment of the method is that the optimization can be expanded to an inter-block movement.

Furthermore, the invention encompasses a magnetic resonance apparatus having a pulse controller. The pulse controller has a computer designed to implement the inventive method. The pulse controller is therefore configured to execute the method according to the invention for activating an MR control sequence.

For this purpose, pulse controller comprises an activation unit designed to activate an MR control sequence that includes an optimized encoding module. Furthermore, the pulse controller has a sensor designed to detect an external movement of the examination object. Furthermore, the pulse controller has an optimization computer designed to perform an optimization of an encoding module of an MR control sequence based on a detected external movement.

The invention enables detection of an external movement of the examination object by a sensor and an optimization of the MR control sequence within a block. The encoding module of a block can be matched by the pulse controller to the excitation module of this block, so that the degrading effect of the external movement on the data to be read out, and thereby on the quality of the resulting images, can be reduced. The pulse controller can make a repetition of recording of the examination object redundant even though an external movement took place during activation of the MR control sequence. This can bring about a time saving.

Embodiments of the inventive magnetic resonance apparatus are designed analogously to the embodiments of the inventive method. The magnetic resonance apparatus can have further control components that are necessary and/or advantageous for implementing the inventive method. The magnetic resonance apparatus can also be designed to send control signals and/or to receive and/or process control signals in order to carry out the inventive method. The pulse controller is preferably part of the control computer of the inventive magnetic resonance apparatus and is preferably connected upstream relatively close to the radio-frequency antenna unit and/or the gradient coil unit. Computer programs and further software can be stored in a memory of the pulse controller, with which a processor of the pulse controller automatically controls and/or carries out a sequence of the inventive method.

The invention also encompasses a non-transitory, computer-readable data storage medium that is encoded with program code (programming instructions) that cause the inventive method to be implemented when the code is executed. The storage medium can be loaded directly into a memory of a programmable computer of a magnetic resonance apparatus. The inventive method can consequently be carried out quickly, robustly and in a way that can be repeated in an identical manner. The computer must have components, such as an appropriate main memory, an appropriate graphics card or an appropriate logic unit, so the respective method steps can be carried out efficiently. Examples of electronically readable data carriers are a DVD, magnetic tape or a USB stick, on which electronically readable control information, in particular software, is stored. When this control information (software) is read from the data carrier and stored in a controller and/or arithmetic unit of the magnetic resonance device, all inventive embodiments of the methods described above can be carried out.

The advantages of the inventive magnetic resonance apparatus and the inventive computer-readable data carrier essentially correspond to the advantages of the inventive method described above in detail. Features, advantages or alternative embodiments mentioned in this context are also applicable to the other aspects of the invention.

DESCRIPTION OF THE PREFERRED EMBODIMENTS

Figure 1:
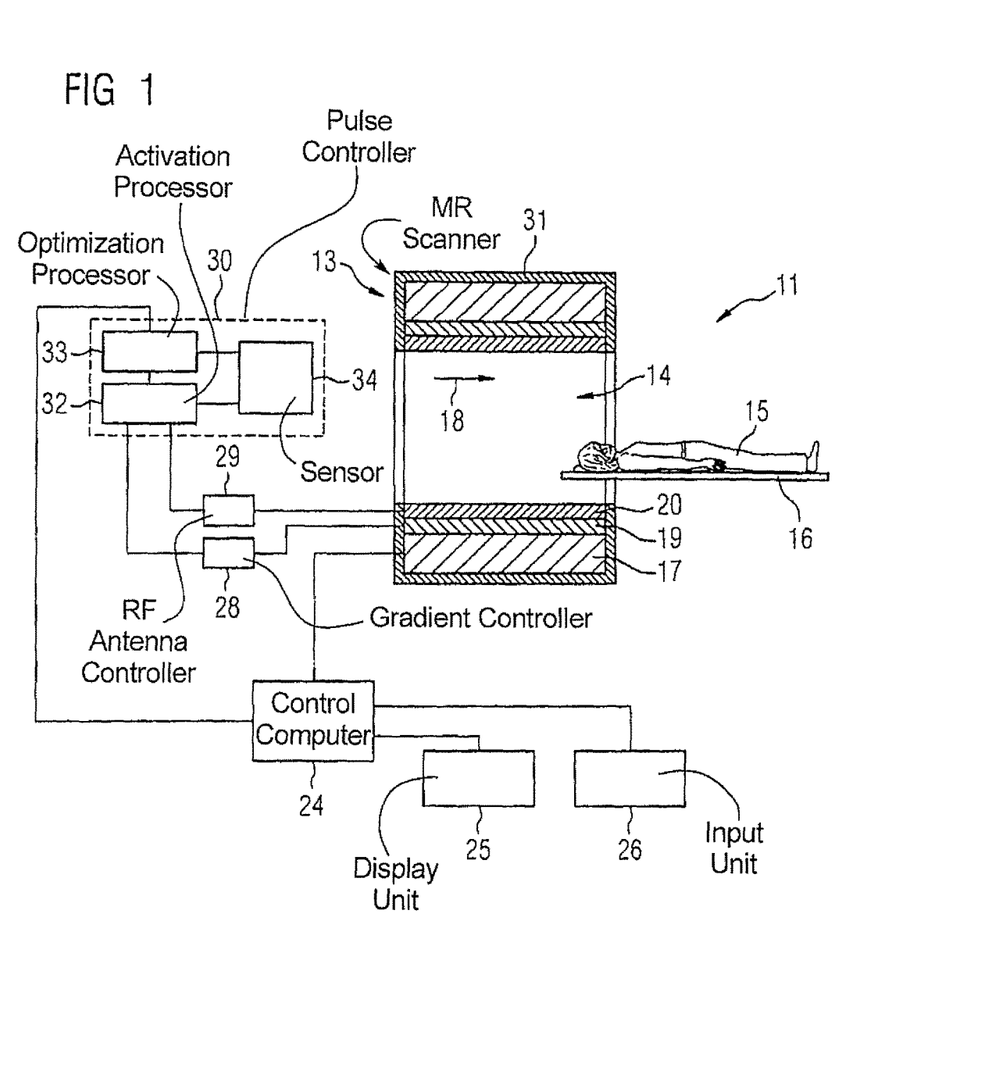
FIG. 1 shows the inventive magnetic resonance apparatus in a block diagram.

FIG. 1 shows the inventive magnetic resonance apparatus 11 for carrying out the inventive method in a block diagram. The magnetic resonance apparatus 11 has a data acquisition unit formed by scanner 13, having a basic field magnet 17 for generating a strong and constant basic magnetic field 18. The scanner 13 has a cylindrical patient-receiving region 14 for receiving a patient, with the patient-receiving region 14 being cylindrically surrounded in a circumferential direction by the scanner 13. The patient 15 can be moved by a patient-positioning device 16 of the magnetic resonance apparatus 11 into the patient-receiving region 14. The patient-positioning device 16 has for this purpose an examination table arranged so as to move inside the magnetic resonance apparatus 11. The scanner 13 is shielded from the outside by a housing shell 31.

The scanner 13 also has a gradient coil arrangement 19. The gradient coil arrangement 19 is controlled by a gradient controller 28. The scanner 13 also has a radio-frequency antenna 20, which in the illustrated case is embodied as a body coil permanently integrated in the scanner 13, and a radio-frequency antenna controller 29. The radio-frequency antenna 20 is controlled by the radio-frequency antenna controller 29 so as to radiate radio-frequency pulses into an examination space, which is essentially formed by the patient-receiving region 14. The radio-frequency pulses excite certain nuclear spins in the patient 15, so as to deflect the excited nuclear spins from the polarization established by the basic magnetic field 18. As the deflected nuclear spins relax and return to the steady state, they emit radio-frequency signals that are called magnetic resonance signals. The detected magnetic resonance signals are entered as numerical values into an electronic memory, which are then transformed into image data.

The magnetic resonance apparatus 11 has a control computer 24 for controlling the basic field magnet 17, the gradient controller 28 and the radio-frequency antenna controller 29. The control computer 24 centrally controls the magnetic resonance apparatus 11, such as for carrying out magnetic resonance control sequences. Control information, such as imaging parameters, and reconstructed magnetic resonance images, can be displayed for a user on a display unit 25, for example on at least one monitor, of the magnetic resonance apparatus 11. Furthermore, the magnetic resonance apparatus 11 has an input unit 26 via which a user can enter information and/or imaging parameters during a scanning process.

The magnetic resonance apparatus 11 also has a pulse controller 30 which has a processor (not shown) for playing an MR control sequence. The pulse controller 30 also has an activation processor 32, an optimization processor 33 and a sensor 34 for this purpose. The sensor 34 is designed to detect an external movement of the patient 15. The magnetic resonance apparatus 11 having the pulse controller 30 is configured to carry out the inventive method.

The control computer 24 can include the gradient controller 28 and/or the radio-frequency antenna controller 29 and/or the display unit 25 and/or the input unit 26 and/or the pulse controller 30.

The illustrated magnetic resonance apparatus 11 can have further components that magnetic resonance apparatuses conventionally have. The general mode of operation of a magnetic resonance apparatus is known to those skilled in the art, moreover, so a detailed description of the further components and such operation is not necessary herein.

Figure 2:
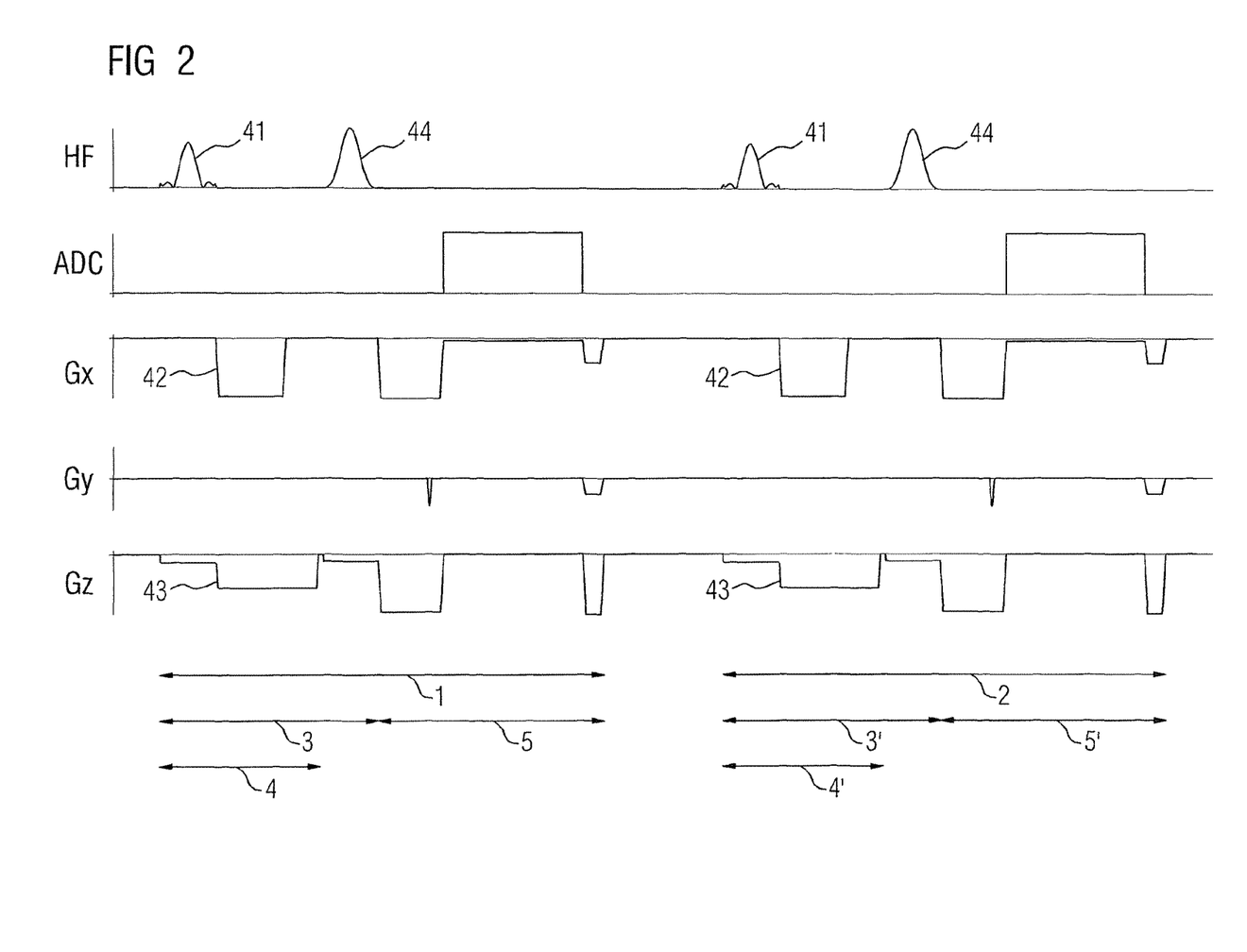
FIG. 2 shows a graph of an MR control sequence.

FIG. 2 shows a graph of an MR control sequence which is capable of recording a recording region. The horizontal axis describes a course over time whereas the amplitudes of the RF pulses (RF) and magnetic field gradient (Gx, Gy and Gz) in the three spatial directions are plotted on the vertical axis. In addition, the course over time of the readout window (ADC) is identified. The graph illustrates a detail of an MR control sequence. The MR control sequence comprises a large number of blocks that are to be played successively, with the first block 1 and the second block 2 being shown. Each block has an excitation module 3 or 3' for exciting spins in a first region of an examination object and an encoding module 5 or 5' for the spatial encoding of spins excited in the first region and for recording of a signal emitted by spins excited in the first region. The excitation module 3 or 3' includes an excitation pulse 44 which is an RF pulse and typically induces a controlled deflection (flip) of the spins from the longitudinal direction into the transverse direction. The signal is recorded during the readout window, i.e. in the periods in which the analog-digital converter (ADC) has an amplitude that is not zero.

The excitation module 3 or 3' includes a preparation module 4 or 4'. The preparation module 4 or 4' has the preparation pulses 41, 42 and 43, with the preparation pulse 41 being an RF pulse and the preparation pulses 42 and 43 being gradient pulses which belong to a spoiler module. The preparation module 4 is designed to prepare a second region that is different from the first region and thereby modulate a signal recorded by the encoding module 5 or 5'. The preparation module 4 or 4' can be used to suppress the signal of the spins which are located in the second region at the time of playing of the preparation pulse 41. If these spins are subject to a spatial change, because they are transported, for example by blood flow for the duration between the preparation pulse 41 and the excitation pulse 44 from the second region into the first region, then these spins do not generate a signal during reading out of the signal by means of the encoding module 5, or 5'. The MR control sequence can consequently be used for blood suppression.

The illustrated MR control sequence is designed such that spatial encoding of the first region requires activation of at least two blocks 1 and 2.

Figure 3:
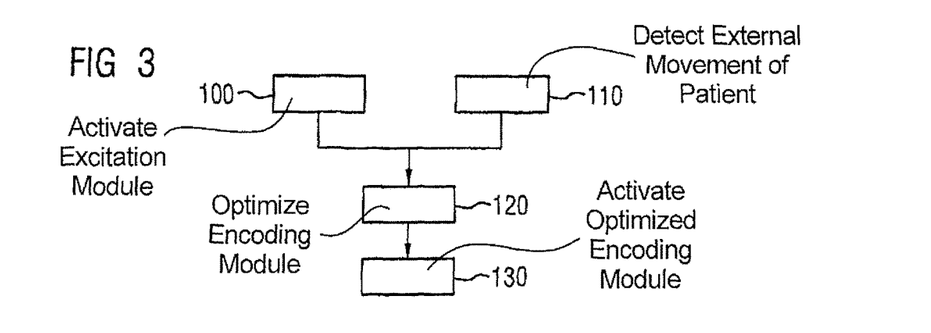
FIG. 3 shows a flowchart of the inventive method.

FIG. 3 shows a flowchart of the inventive method for activating an MR control sequence. The method starts from an MR control sequence schematically illustrated in FIG. 2. The excitation module 3 of the first block 1 is activated in method step 100. During this there is an external movement of the patient 15 which is detected by the sensor 34 in method step 110. In the following method step 120 the optimization computer 33 carries out an optimization of the encoding module 5 of the first block 1 based on the detected external movement and generates an optimized encoding module. The optimized encoding module is played in method step 130.

Figure 4:
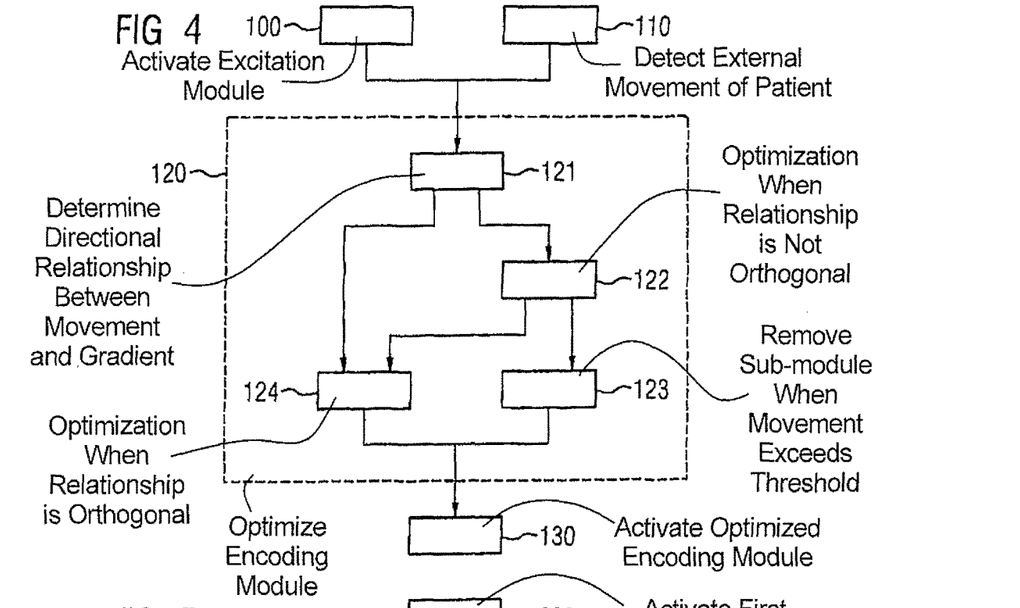
FIG. 4 shows a flowchart of another embodiment of the inventive method.

FIG. 4 shows a flowchart of an embodiment of the inventive method for activating an MR control sequence. Analogously to the method illustrated in FIG. 3 the method starts from an MR control sequence schematically illustrated in FIG. 2. The excitation module 3 of the first block 1 is activated in method step 100. During this there is an external movement of the patient 15 which is detected by means of the sensor 34 in method step 110. The optimization computer 33 carries out an optimization of the encoding module 5 of the first block 1 in the following method step 120 based on the detected external movement and generates an optimized encoding module. Method step 120 comprises further method steps for this. The optimization computer 33 first determines in method step 121 the relationship of the direction of the external movement to the direction of a magnetic field gradient 42, 43 encompassed by the preparation module 4. Furthermore, the optimization computer 33 can take into account at least one of the following factors during optimization of the encoding module 5:

a direction of the external movement, a direction of a magnetic field gradient encompassed by the excitation module 3, a direction of a magnetic field gradient encompassed by the encoding module 4, a relationship of at least two of the above-mentioned directions to each other.

If the direction of the external movement is orthogonal to the direction of a magnetic field gradient 42, 43 encompassed by the preparation module 4, then method step 124 follows, the optimization of the encoding module 5 according to the first optimization strategy. In the case illustrated in FIG. 2 the direction along Gy would be, for example, orthogonal to both magnetic field gradients 42 and 43 encompassed by the preparation module 4.

The first optimization strategy provides that the effect of the external movement on a conformity of the excitation module 3 and encoding module 5 is reduced.

If the direction of the external movement is not orthogonal to the direction of the magnetic field gradients 42, 43 encompassed by the preparation module 4, and instead the two directions, in particular, largely match, then method step 122 follows, the optimization of the encoding module 5 according to the second optimization strategy. The second optimization strategy provides that a threshold value is given for the intensity of the external movement and the method continues as a function of the threshold value. If the intensity of the detected external movement undershoots, for example, the threshold value, then the method can continue according to the first optimization strategy and method step 124 follows method step 122. If the intensity of the detected external movement exceeds, for example, the threshold value, then according to method step 123 at least one sub-module encompassed by the encoding module 5 can be removed during optimization of the encoding module 5, whereby the optimized encoding module is formed. When carrying out method step 130 it can also be defined that the first block 1 is activated once again.

Method step 130 can follow both method step 124 and method step 123, wherein the optimized encoding module is activated.

Figure 5:
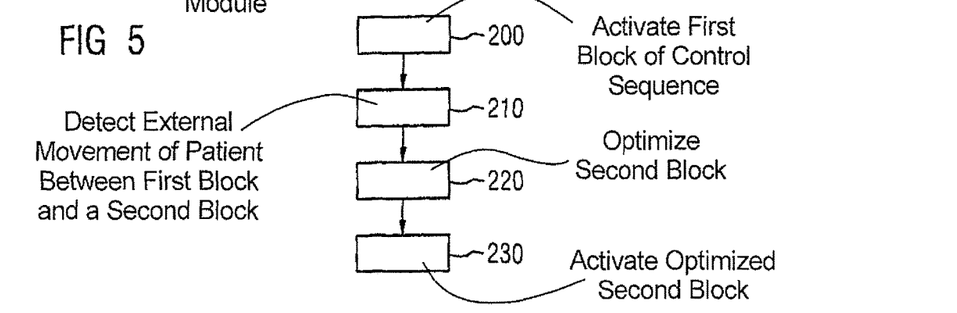
FIG. 5 shows a flowchart of a further embodiment of the inventive method.

FIG. 5 shows a flowchart of a further embodiment of an inventive method for playing an MR control sequence. The method starts from an MR control sequence schematically illustrated in FIG. 2. The first block 1 is activated in method step 200. In method step 210 the sensor 34 detects an external inter-block movement of the patient 15 between the first block 1 that is to be activated and the second block 2 that is to be activated. In method step 220 the optimization computer 33 optimizes the second block 2 that follows the first block 1. The optimized second block is activated in method step 230.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for activating a magnetic resonance (MR) control sequence, comprising:

providing a processor with an electronic designation representing an MR control sequence comprising a plurality of blocks that are to be activated successively in order to operate an MR data acquisition scanner with said MR control sequence, wherein at least one block in said plurality of blocks comprises an excitation module for exciting nuclear spins in a first region of an examination object in the scanner and wherein said excitation module comprises a preparation module comprising at least one preparation pulse that prepares nuclear spins in a second region of the examination subject, and an encoding module for spatially encoding the spins excited in said first region and for reading out a spatially encoded MR signal emitted by the spins that are excited in the first region, with said encoded MR signal being modulated by the prepared nuclear spins in said second region;

with a sensor, detecting an external movement of the examination object during activation of the excitation module of said at least one block;

in said processor, optimizing the encoding module of said at least one block dependent on the detected external movement, and thereby generating an optimized encoding module; and activating said scanner with the optimized encoding module in said MR control sequence provided as an output from said processor to said scanner.

2. A method as claimed in claim 1 wherein said encoding module comprises activation of a magnetic field gradient, and comprising optimizing said encoding module by adjusting said magnetic field gradient according to an optimization strategy to cause an effect of said external movement on a conformity of said excitation module and said encoding module to be reduced.

3. A method as claimed in claim 2 wherein said optimization strategy is a first optimization strategy, and comprising, in a second optimization strategy, determining a threshold value on said processor for an intensity of said external movement and, selectively, executing said first optimization strategy, or removing at least one sub-module encompassed by the encoding module, and activating said at least one block a second time during optimization of said encoding module, dependent on said threshold value and the intensity of the detected external movement.

4. A method as claimed in claim 2 comprising executing said first optimization strategy when a direction of a magnetic field encompassed by the excitation module is orthogonal to a direction of said external movement during optimization of said encoding module.

5. A method as claimed in claim 4 wherein said optimization strategy is a first optimization strategy, and executing a second optimization strategy when a direction of a magnetic field gradient encompassed by said excitation module matches a direction of the external movement during optimization of said encoding module.

6. A method as claimed in claim 1 comprising, with said sensor, detecting an external inter-block movement of the examination object, which occurs between a preceding block and a block that follows said preceding block, and optimizing the encoding module in the following block dependent on said external inter-block movement.

7. A method for activating a magnetic resonance (MR) control sequence, comprising:

providing a processor with an electronic designation representing an MR control sequence comprising a plurality of blocks that are to be activated successively in order to operate an MR data acquisition scanner with said MR control sequence, wherein at least one block in said plurality of blocks comprises an excitation module for exciting nuclear spins in an region of an examination object in the scanner, and an encoding module for spatially encoding the spins excited in said region by activating at least two blocks of said MR control sequence, and for reading out a spatially encoded MR signal emitted by the spins that are excited in the region;

with a sensor, detecting an external movement of the examination object during activation of the excitation module of said at least one block;

in said processor, optimizing the encoding module of said at least one block dependent on the detected external movement by activating at least two blocks of said MR control sequence, and thereby generating an optimized encoding module; and activating said scanner with the optimized encoding module in said MR control sequence provided as an output from said processor to said scanner.

8. A method as claimed in claim 1 for activating a magnetic resonance (MR) control sequence, comprising:

providing a processor with an electronic designation representing an MR control sequence comprising a plurality of blocks that are to be activated successively in order to operate an MR data acquisition scanner with said MR control sequence, wherein at least one block in said plurality of blocks comprises an excitation module for exciting nuclear spins in an region of an examination object in the scanner, and an encoding module for spatially encoding the spins excited in said region by activating at least two blocks of said MR control sequence, and for reading out a spatially encoded MR signal emitted by the spins that are excited in the region;

with a sensor, detecting an external movement of the examination object during activation of the excitation module of said at least one block;

in said processor, optimizing said encoding module dependent on at least one of a direction of said external movement, a direction of a magnetic field gradient activated in said excitation module, a direction of a magnetic field gradient activated in said encoding module, and a relationship of at least two of said directions with respect to each other, and thereby generating an optimized encoding module; and activating said scanner with the optimized encoding module in said MR control sequence provided as an output from said processor to said scanner.

9. A magnetic resonance (MR) apparatus comprising:

an MR data acquisition scanner;

a processor provided with an electronic designation representing an MR control sequence comprising a plurality of blocks that are to be activated successively in order to operate said MR data acquisition scanner with said MR control sequence, wherein at least one block in said plurality of blocks comprises an excitation module for exciting nuclear spins in an region of an examination object in the scanner, and an encoding module for spatially encoding the spins excited in said region by activating at least two blocks of said MR control sequence and for reading out a spatially encoded MR signal emitted by the spins that are excited in the region;

a sensor that detects an external movement of the examination object during activation of the excitation module of said at least one block;

said processor being configured to optimize the encoding module of said at least one block dependent on the detected external movement, and thereby generate an optimized encoding module; and said processor being configured to activate said scanner with the optimized encoding module in said MR control sequence when said scanner is operated from said processor with said MR control sequence.

10. A non-transitory, computer-readable data storage medium encoded with programming instructions, said storage medium being loaded into a controller of a magnetic resonance (MR) apparatus that comprises an MR data acquisition scanner, and a movement sensor, said programming instructions causing said controller to:

receive an electronic designation representing an MR control sequence comprising a plurality of blocks that are to be activated successively in order to operate the MR data acquisition scanner with said MR control sequence, wherein at least one block in said plurality of blocks comprises an excitation module for exciting nuclear spins in a first region of an examination object in the scanner and wherein said excitation module comprises a preparation module comprising at least one preparation pulse that prepares nuclear spins in a second region of the examination subject, and an encoding module for spatially encoding the spins excited in said region and for reading out a spatially encoded MR signal emitted by the spins that are excited in the first region, with said encoded MR signal being modulated by the prepared nuclear spins in said second region;

receive a sensor signal representing an external movement of the examination object during activation of the excitation module of said at least one block;

optimize the encoding module of said at least one block dependent on the detected external movement, and thereby generating an optimized encoding module; and activate said scanner with the optimized encoding module in said MR control sequence provided as an output from said processor to said scanner.

* * * * *